(12) United States Patent
Bhavnagarwala (10) Patent No.: US 11,984,888 B2
(45) Date of Patent: May 14, 2024

(54) CIRCUITS AND METHODS TO HARVEST ENERGY FROM TRANSIENT ON-CHIP DATA

(71) Applicant: Azeez Bhavnagarwala, Newtown, CT (US)

(72) Inventor: Azeez Bhavnagarwala, Newtown, CT (US)

(73) Assignee: Metis Microsystems, LLC, Newtown, CT (US)

(*) Notice: Subject to any disclaimer, the term of this patent is extended or adjusted under 35 U.S.C. 154(b) by 0 days.

(21) Appl. No.: 17/498,220

(22) Filed: Oct. 11, 2021

(65) Prior Publication Data
US 2022/0321123 A1    Oct. 6, 2022

Related U.S. Application Data (60) Provisional application No. 63/139,744, filed on Jan. 20, 2021, provisional application No. 63/090,169, filed on Oct. 9, 2020.

(51) Int. Cl.
| | |
|---|---|
| *H03K 19/00* | (2006.01) |
| *G01R 19/165* | (2006.01) |
| *H03K 19/094* | (2006.01) |
| *H03K 19/096* | (2006.01) |
| *H03K 19/20* | (2006.01) |

(52) U.S. Cl.
CPC ... *H03K 19/0019* (2013.01); *G01R 19/16552* (2013.01); *H03K 19/0013* (2013.01); *H03K 19/094* (2013.01); *H03K 19/0963* (2013.01); *H03K 19/20* (2013.01)

(58) Field of Classification Search
CPC .......... H03K 19/0963; H03K 19/0013; H03K 19/20; H03K 19/0185; H03K 19/0019
See application file for complete search history.

(56) References Cited

U.S. PATENT DOCUMENTS

| | | | |
|---|---|---|---|
| 7,463,054 B1 * | 12/2008 | Parris | H03K 19/0008 326/86 |
| 9,935,636 B1 * | 4/2018 | Liran | H03K 19/018521 |

(Continued)

OTHER PUBLICATIONS

Alimadadi, Mehdi, et al., "A 4 GHz Non-Resonant Clock Driver With Inductor-Assisted Energy Return to Power Grid", IEEE Transactions on Circuits and Systems I: Regular Papers (Aug. 2010); 57(8): 2099-2108.

(Continued)

*Primary Examiner* — Tuan T Lam (57) ABSTRACT

Circuits and methods that harvest electrostatic energy from transient on-chip data are described in the Application. In one aspect, a method and inverter circuit harvests electrostatic charge held at its output node at an electric potential comparable to the power supply voltage rail to a common grid/node as the output makes a 1→0 logic transition. This charge harvested at a common grid/node can be used by circuits (described in applications 63/090,169, 63/139,744) to drive 0→1 logic transition at their output nodes at lower energy drain from the on-chip power grid than a conventional CMOS inverter would with similar performance, slew rates at inverter input and output and with similar output driving transistor geometries.

20 Claims, 4 Drawing Sheets

(56) References Cited

U.S. PATENT DOCUMENTS

| | | | | |
|---|---|---|---|---|
| 2008/0238474 | A1* | 10/2008 | Fairbanks | H03K 19/01721 326/17 |
| 2014/0266327 | A1* | 9/2014 | Ancis | H03K 19/0019 327/112 |
| 2016/0254844 | A1 | 9/2016 | Hull et al. | |
| 2017/0116443 | A1 | 4/2017 | Bolic et al. | |
| 2023/0112781 | A1 | 4/2023 | Bhavnagarwala | |
| 2023/0268923 | A1 | 8/2023 | Bhavnagarwala | |

OTHER PUBLICATIONS

Athas, William C., et al., "A low-power microprocessor based on resonant energy", IEEE Journal of Solid-State Circuits (Nov. 1997); 32(11): 1693-1701.

Bhavnagarwala, Azeez, et al., "Fluctuation limits & scaling opportunities for CMOS SRAM cells", IEDM Technical Digest (Dec. 2005); 659-662.

Chen, Yu-Hsin, et al., "Understanding the Limitations of Existing Energy-Efficient Design Approaches for Deep Neural Networks", SYSML'18 (Feb. 2018); 3 pages.

Choe, Swee Yew, et al., "Dynamic Half Rail Differential Logic for Low Power", 1997 IEEE International Symposium on Circuits and Systems (Jun. 9-12, 1997); pp. 1936-1939.

Kim, Keejong, et al., "A Low-Power SRAM Using Bit-Line Charge-Recycling", IEEE Journal of Solid-State Circuits (Feb. 2008); 43(2): 446-459.

Kong, Bai-Sun, et al., "Charge recycling differential logic (CRDL) for low power application", IEEE Journal of Solid-State Circuits (Sep. 1996); 31(9): 1267-1276.

Lee, Jungho, et al., "Split-level precharge differential logic: a new type of high-speed charge-recycling differential logic", IEEE Journal of Solid-State Circuits (Aug. 2001); 36(8): 1276-1280.

Liu, Yong, et al., "A 0.1pJ/b 5-to-10Gb/s charge-recycling stacked low-power I/O for on-chip signaling in 45nm CMOS SOI", 2013 IEEE International Solid-State Circuits Conference Digest of Technical Papers (2013); 400-401.

Rajapandian, Saravanan., et al., "Energy-efficient low-voltage operation of digital CMOS circuits through charge-recycling", 2004 Symposium on VLSI Circuits. Digest of Technical Papers (IEEE Cat. No. 04CH37525), IEEE (2004); 330-331.

Svensson, Lars., "Adiabatic Switching", Low power digital CMOS design (1995); 181-218; Springer, Boston, MA.

Wilson, John M., et al., "8.6 A 6.5-to-23.3fJ/b/mm balanced charge-recycling bus in 16nm FinFET CMOS at 1.7-to-2.6Gb/s/wire with clock forwarding and low-crosstalk contraflow wiring", 2016 IEEE International Solid-State Circuits Conference (ISSCC). IEEE (2016); 156-157.

Yang, Byung-Do, "A Low-Power SRAM Using Bit-Line Charge-Recycling for Read and Write Operations", IEEE Journal of Solid-State Circuits (Oct. 2010); 45(10): 2173-2183.

Yang, Tien-Ju, et al., "Designing Energy-Efficient Convolutional Neural Networks Using Energy-Aware Pruning", Proceedings of the IEEE Conference on Computer Vision and Pattern Recognition (2017); pp. 6071-6079.

Extended European Search Report for EP Application No. 22202622. 1, dated Apr. 4, 2023, 9 pages.

Non-Final Office Action for U.S. Appl. No. 17/497,974 dated Apr. 28, 2023, 6 pages.

Restriction Requirement for U.S. Appl. No. 17/951,050 dated Jun. 30, 2023, 4 pages.

Non-Final Office Action for U.S. Appl. No. 17/951,050 dated Mar. 1, 2024, 9 pages.

* cited by examiner

CIRCUITS AND METHODS TO HARVEST ENERGY FROM TRANSIENT ON-CHIP DATA

CROSS-REFERENCE TO RELATED APPLICATIONS

This application claims priority to and benefit of U.S. Provisional Application No. 63/090,169 filed on Oct. 9, 2020 and U.S. Provisional Application No. 63/139,744 filed on Jan. 20, 2021, the entire disclosures of each of which are incorporated herein by reference in its entirety.

FIELD OF INVENTION

The present invention relates to harvest of electrostatic energy from transient on-chip data to improve the energy efficiency of digital CMOS circuit operation.

BACKGROUND OF INVENTION

In recent years, deep neural networks (DNNs) have become the solution for many AI applications including computer vision, speech recognition and robotics implementing machine learning methods. While these neural networks deliver sufficient accuracy—it comes at the cost of high computational complexity with associated power drain limiting deep learning from being deployed on mobile devices with limited energy budgets. Smart phones for example, cannot run object classification with AlexNet in real-time for more than an hour. Network issues of latency, bandwidth and availability could require battery/ambient powered IoT devices on the edge to not only sense and act without communicating to the cloud but also to take on more computationally intense tasks of learning or training a neural network. Neural networks for a myriad of IoT devices can easily result in model sizes that are enormous—becoming computationally burdensome to. their energy resources, demanding energy budgets that exceed provisions from batteries and conventional energy harvesting methods. Even where power is abundantly available as in a data center supporting AI workloads, where GPU accelerators consume as much as 400 W, the cost of electricity and the performance limits imposed by heat removal efficiency can be improved by lowering the switching (or Dynamic) energy consumption of digital CMOS circuits

PRIOR ART

In many applications requiring high speed CMOS circuit operation, precharged dynamic circuit techniques are preferred. These circuits are typically operated by pre-charging output nodes to the supply voltage during a pre-charge phase every clock cycle and conditionally discharging some of them, depending on the inputs during the evaluation phase. These techniques are energy inefficient since all of the charge discarded to the reference ground potential during evaluate must be resupplied during precharge phase of the next clock cycle. High peak currents can also cause large di/dt noise causing voltage bumps in power rails with associated risks to signal integrity and reliability in high performance CMOS components.

Dynamic logic circuits that recycle some of the charge were proposed to improve the energy efficiency of circuit operation. These circuit techniques precharge complementary outputs to half $V_{DD}$ by charge sharing from the previous evaluation state, enabling a maximum of a 50% reduction in energy. Such schemes are relevant only when complementary signal pairs are used in implementing complex logic functions. Also, much of the charge recycle benefits are lost with performance degraded as well due to (i) high overheads in device count (ii) requirement of using complementary inputs and as many as 2-3 clock and enable inputs to each logic gate with their associated additional routing, performance and power overheads (iii) use of cross-coupled inverters as output drivers which increase the uncertainty of gate metrics in the presence of parameter variations and the offsets they develop, and (iv) with only a half-VDD gate-source voltage precharged to output and input nodes of output drivers for charge recycle operation, gate overdrive is degraded during evaluation phase. In one comparison with static CMOS implementing full adders, the power-delay product of a full adder increases total energy nearly 10% over static CMOS. Moreover, neural network energy consumption is dominated by movement of data across the memory hierarchy and the chip and not by dissipation from computation.

On-chip small voltage swing signaling schemes have attempted charge recycling by stacking components (such as logic and. clocking circuits) with predictable data switching activities in two adjacent voltage domains using simple push-pull regulators to balance current between the two domains to maintain the voltage at their interface. This approach could deliver a maximum of a quadratic reduction in power. Inefficiency introduced by voltage regulation is eliminated if the current between domains is matched. An approach to stack voltage domains without requiring regulators between them has been reported using a balanced charge recycling bus where differing data activity between two links is compensated by swapping data between them periodically so that switching activity along the bus is exactly matched. These schemes however, are difficult to implement and also require circuits in the domains to be powered by reduced operating voltages.

Charge recycling techniques have been reported where the flow of electric charge from the supply rail ($V_{DD}$) to Ground is traced through more than one circuit/use through multiple voltage domains. However, there is no energy advantage from recycling the charge through multiple voltage domains since it costs as much in energy to raise charge to the highest voltage domain as it does to do so cumulatively in each of the stacked domains operating independently. The energy advantage of stacking voltage domains is only in removing she inefficiencies of on-chip voltage regulation from $V_{DD}$ to much lower voltages that these domains would be powered with to benefit from quadratic reductions in their switching power. If the current between domains is not matched, the energy overhead consumed by regulators attempting to maintain domain interface at a fixed voltage, could diminish the quadratic energy improvements from operating each domain at reduced voltages.

Non-resonant approaches to returning/recycling stored energy on load capacitance include use of an inductor to discharge load capacitor of a clock network to the power grid instead of it being discharged to ground. However, overheads of inductors, decoupling capacitors, integration with clock gating (and its accompanying overheads), and limited application to large clock load capacitances (as seen in a clock mesh) are challenges seen with this approach making it impractical and difficult implement.

Smaller voltage transitions for each logic operation using 'recycled charge' also come with the disadvantages of smaller margins and lower performance. In multiple instances, these make implementations impractical. For e.g., in, a smaller (than $V_{DD}$) voltage is applied across a BL pair during an SRAM Write operation to enable lower energy dissipation per Write operation. By sharing/recycling charge across a set of BL pairs, Writes are attempted with smaller voltage swings on the BL (instead of full rail-rail BL swings during a conventional SRAM Write). For small geometry devices it becomes harder to write to the bitcell even with the full supply voltage across a bit line pair—due to increasing electrical variability seen in small-geometry bitcell transistors. Circuit overheads introduced by full CMOS transmission gates to move charge between columns comes at a significant cost in area, control and performance.

Adiabatic switching in reversible logic circuits moves charge from the power supply to a load capacitance using slow constant current charging without energy dissipation. It enables the recycling of energy to reduce the total energy drawn from the power supply by reversing the current source using non-standard AC or pulsed power supplies with time varying voltage or current. In sharp contrast to conventional CMOS circuit operation, charge and energy are not discarded after being used, only once—with pulsed/sinusoidal power supplies designed to be able to retrieve the energy fed back to it. The problem areas limiting realization of practical low-power operation of CMOS chips using adiabatic or reversible logic techniques: (1) the energy-efficient design of the combined power supply and clock generator (2) logical overhead needed to support reversible logic functions and (3) the alternative of scaling operating voltages with feature size and improving performance—that comes with conceptual simplicity and high payback of lower power dissipation, has been preferred by industry.

SUMMARY OF INVENTION

Conventional CMOS operation as illustrated by an inverter driving a capacitive load C and which draws energy equal to $CV_{DD}^2$ from the power supply rail at voltage $V_{DD}$ during a 0→1 transition at its output, of which energy equal to (½) $CV_{DD}^2$ is stored at the output. A 1→0 transition at the output discharges all of this stored energy to the reference ground potential of the inverter at voltage Vss=0V.

In the proposed invention, an inverter driving the same capacitive load C as the above conventional CMOS inverter, draws energy equal to $CV_{DD}^2$—as a conventional CMOS inverter would, but a 1→0 transition at its output node harvests a fraction a of the charge held at the output to a common grid/node raising its electric potential (where a is a positive fraction <1). Typical values of a are 0.25-0.4

DETAILED DESCRIPTION OF PREFERRED EMBODIMENTS

Figure 1:
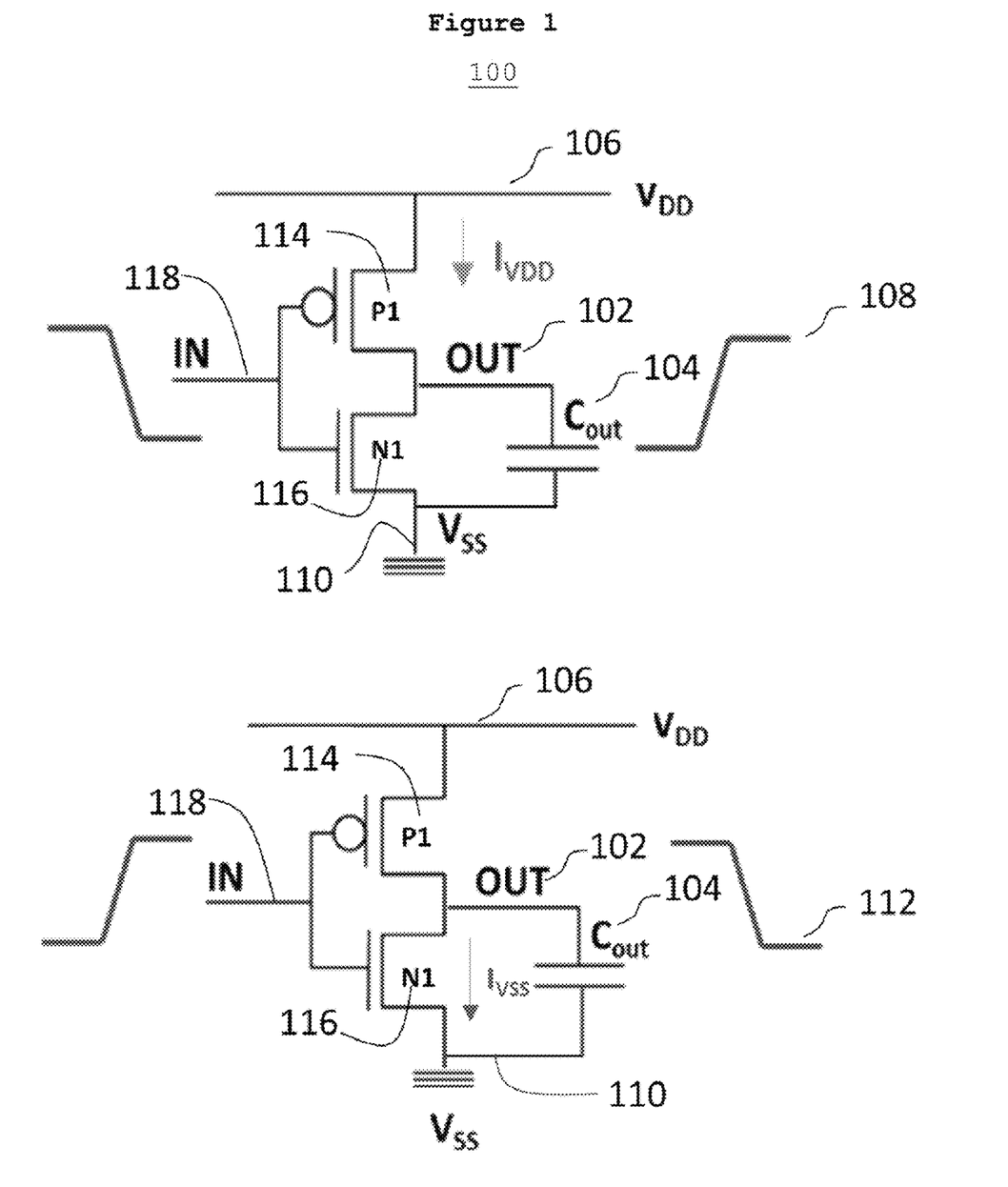
FIG. 1 is a schematic illustrating conventional CMOS circuit schematic of an inverter and its operation in response to 1→0 and 0→1 input transitions

FIG. 1 is a schematic illustrating operation of a conventional CMOS inverter 100 driving output node OUT 102 with a capacitive load Cout 104. The power rail 106 at electric potential $V_{DD}$ provides total energy equal to $C_{out}$ 104 (derived in equation (1) below) during a 0→1 transition 108 at the output node OUT 102, storing energy of (½)$C_{out}V_{DD}^2$ on the capacitor 104 at the output 102 modeled by equation (2) below. A 1→0 112 transition at the output 102 discharges from $C_{out}$ 104 all of this stored energy on the capacitor $C_{out}$ 104 at the output 102 to the reference ground node 110 at electric potential Vss=0V Energy Drawn from VDD Supply (During 0→1 Transition at Output)

$$\int I_{VDD}(t)V_{DD}dt = \int_{VSS}^{VDD} C_{out}V_{DD}dV_{out} = C_{out}V_{DD}^2 \quad (1)$$

Energy Stored at Output $$\int I_{VDD}(t)V_{out}(t)dt = \int_{VSS}^{VDD} C_{out}V_{out}dV_{out} = \tfrac{1}{2}C_{out}V_{DD}^2 \quad (2)$$

Energy Discharged from Output (During 0→1 Transition at Output)

$$\int I_{VSS}(t)V_{out}(t)dt = \int_{VDD}^{VSS} C_{out}V_{out}dV_{out} = \tfrac{1}{2}C_{out}V_{DD}^2 \quad (3)$$

Figure 2:
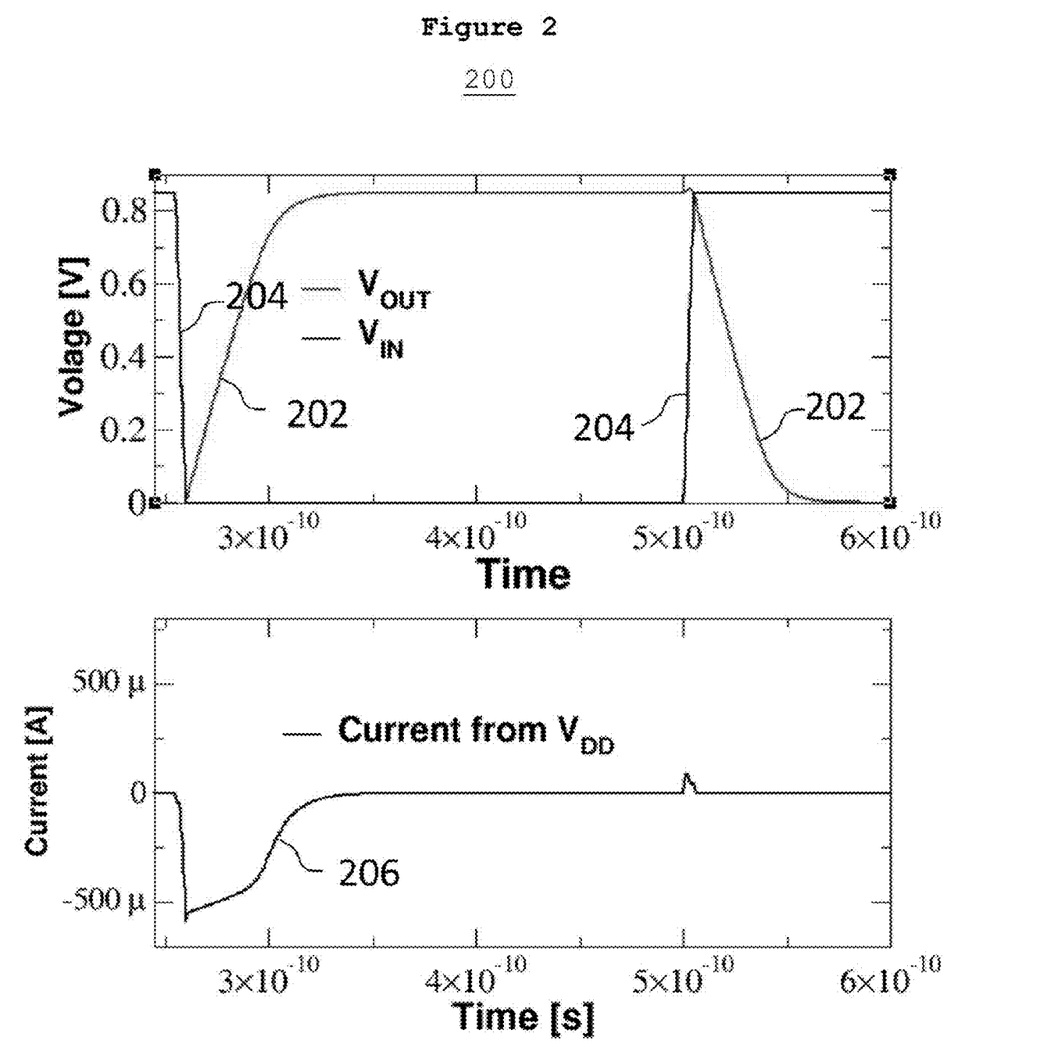
FIG. 2 is a circuit simulation of the conventional CMOS inverter circuit that shows voltage waveforms at the input and at the output terminals of the inverter in response to 1→0 and 0→1 input transitions. The Figure also shows the current waveform that illustrates the current flow dependence on time for the 0→1 transition at the output and the 1→0 transition at the output

FIG. 2 200 is an illustration of the time dependent voltage waveforms of the output node OUT (102 in FIG. 1 100) shown as the waveform $V_{OUT}$ 202 in FIG. 2. The voltage waveform driving the input of the inverter 118 in FIG. 1, is shown in FIG. 2 as $V_{IN}$ 204

The waveform of current flow 206 into the inverter from the power rail at voltage $V_{DD}$ (106 in FIG. 1) is shown along the same x-axis of time (as used to plot voltage waveforms) in FIG. 2. The absolute value of the integral of the current waveform 206 over time in FIG. 2 200 equals the total charge Q drained from the power rail (106 in FIG. 1) to drive the output node 102 from 0→1. The energy consumed from the power rail 106 to accomplish this logic transition at the output node 102 equals [Q·$V_{DD}$]=$C_{out}V_{DD}^2$ modeled in equation (1) above.

Figure 3:
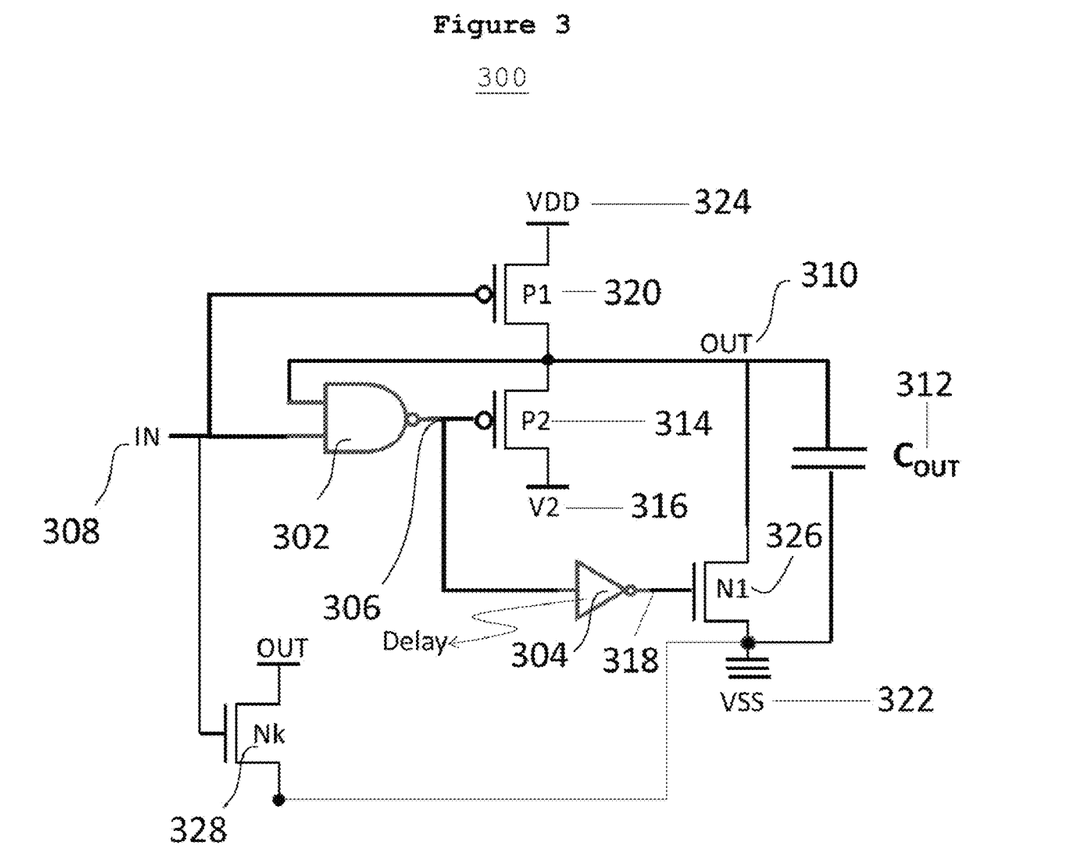
FIG. 3 is a schematic illustrating the proposed circuit of an inverter that harvests charge from its output at VDD to a common grid/node capacitance when the output makes a 1→0 logic transition moving 0.4×-0.25× of the charge held at its output at VDD to the harvest grid/node V2.

In FIG. 3 the proposed circuit schematic 300 functioning as an inverter shows a 2-input NAND 302 and a delay element 304 that also inverts its input. The 2-input NAND 302 and a delay element 304 have devices with much smaller widths (~⅕ of driver transistors) than the other transistors (326, 314, 320).

The NAND gate 302 in this schematic generates an active low pulse at its output node 306 whose leading edge is triggered by a 0→1 transition at the input 308 and whose trailing edge is triggered by a 1→0 transition at the output node 310 loaded with a total capacitance $C_{OUT}$ 312.

The leading edge of this active low pulse turns on PFET P2 314 which drives charge from the output node at logic '1' and voltage VDD to be harvested on the common grid/node V2 316 (typically at a voltage between VSS and VDD and preferably at a voltage comparable to or lower than the logic threshold of the NAND gate 302).

The leading edge of the active low pulse at the output of the NAND gate 306, when delayed and inverted to drive the gate input 318 of NFET N1 326, turns on NFET N1 326 to begin discharging the output 310 to VSS—as the output voltage at node OUT 310 approaches V2. Note that a design requirement on the logic threshold voltage of the NAND gate 302 is that it is higher than the typical voltage node V2 would be raised to with harvested charge or during a dynamic equilibrium when rate of charge transfer to and from the common grid/node are balanced. Thus, node OUT 310 when being discharged to V2 through PFET P2 314, can trip the NAND 302 to produce the trailing low→high transition of the active low pulse at output of the NAND gate 306 to turn-off P2 314.

The NAND 302 would also trip when the N channel FET N1 326 begins conducting after the delayed and inverted leading edge of the active low pulse output from the NAND is inverted by the delay element 304 whose output turns on N1 326.

The output continues being discharged toward VSS—the reference ground terminal 322 as N1 326 is turned on. The trailing edge of the active high pulse driving the gate input terminal of the N channel FET, N1 326 turns this NFET, N1 326 off. A small geometry keeper HVT NFET 328 holds the output to VSS. Its gate input is driven by the inverter input 308 with its source terminal connected to the reference ground voltage rail 322 at voltage VSS=0V and. its drain terminal connected. to OUT 310.

The trailing edge of the active low pulse at the output of the NAND 306 is triggered by the transition at the output node from VDD toward V2 since the logic threshold of the NAND 302 is higher than the voltage at which node V2 316 is typically charged to with harvested charge. The trailing edge is triggered by this feedback from OUT 310 to the input of the NAND 306.

The proposed circuit (1) maintains rail-rail operation (2) drives practically the same waveforms at its output as a conventional inverter and (3) while harvesting about 25%-40% of the total charge it discharges from its output 310—to the harvest grid node V2 316, instead of discharging all of that charge to the reference ground supply rail 322. The primary overhead in area is consumed by the PFET P2 in FIG. 3. The gates in FIG. 3 are small and can be replaced by equivalent standard cells. Transistors N1 326, P1 320 in FIG. 3 are identical to the transistors 116 and 114 in the schematic of the inverter in FIG. 1 100.

Figure 4:
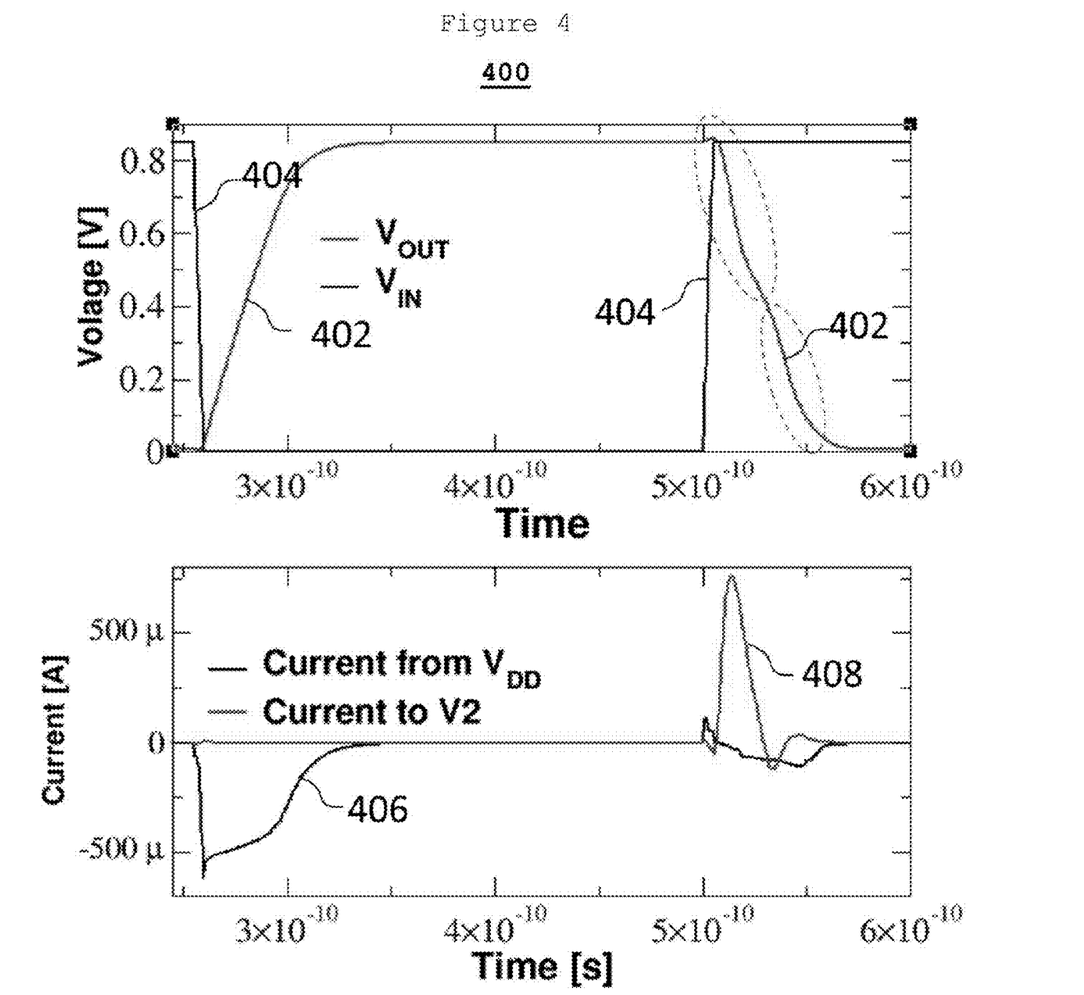
FIG. 4 is a circuit simulation of the proposed inverter circuit that harvests charge during a 1→0 logic transition at its output—showing voltage waveforms at the input and output terminals (that are practically identical to those observed in a conventional CMOS inverter (FIG. 2)) and current waveforms corresponding to current drawn from the power rail at voltage of VDD and current to the common grid/node V2 at voltage VDD/2

The NAND gate 302 and the delay element 304 can be optimized to maximize the energy harvested, at the grid/node from the output node of the inverter—according to what voltage the harvested charge is typically held at when using the proposed inverter. The closer the voltage of the harvested charge at V2 316 is to VDD, the higher the optimal logic threshold voltage of the NAND gate 302 should be (to avoid reverse flow of current from harvest grid/node to output node of inverter) and the shorter the delay value of the delay element 304 needs to be to minimize the delay overheads to accomplish the same 1→0 transition at the output of the inverter. This optimization is especially useful when operating at low, near threshold voltages FIG. 4 400 is an illustration of the time dependent voltage waveforms of the output node OUT (310 in FIG. 3) shown as $V_{OUT}$ 402 in FIG. 4. The input waveform driving the input 308 of the inverter in FIG. 3, $V_{IN}$ 404 is also shown in FIG. 4.

The waveform of current flow 406 into the inverter from the VDD power rail (324 in FIG. 3) is shown along the same x-axis (as used to plot voltage waveforms) in FIG. 4. The absolute value of the integral of this current 406 over time in FIG. 4 400 equals the total charge Q drained from the power rail (324 in FIG. 3) to drive the output from 0→1. Note that this charge is the same as drained by a conventional CMOS inverter shown in FIG. 2. The total charge transferred to the common grid/node V2 316 in FIG. 3 is the total area under the curve 408 in FIG. 4.

Note that the voltage waveform at the output node 310 in FIG. 3 is practically the same as the voltage waveform 202 of the output node (102 in schematic shown in FIG. 1) in FIG. 2 of a conventional inverter. In the schematic in FIG. 3 300 the total charge harvested from the output node 310 during a 1→0 transition to the common grid/node V2 316 is 25%-40% of the total charge drained from the power rail 324 in FIG. 3. Total current in the comparison is based on simulation of the entire circuit shown in FIG. 1 100 and FIG. 3 300—and thus includes parasitic contributions of all transistors to circuit operation. All parasitic capacitances of transistors and local wires in the complete schematic contribute to slew rate seen at the output and overheads incurred in propagation delay.

Switching energy consumption by logic gates with low fanouts (<4) are typically small. Gates driving a high fanout (>10) and/or long wires consume more energy and are best candidates for the proposed scheme that harvests charge from these large loads as they are discharged.

The transistor count increases in the proposed schematic shown in FIG. 3 300 compared to the 2 transistors used in a conventional CMOS inverter. However, the area consumed by the proposed schematics in FIG. 3 300 does not increase proportionally with the number of transistors because the transistors of gates (302, 304 in FIG. 3) are ~5× smaller than any of the transistors (326, 314 and 320 in FIG. 3 300). This because the load seen by the NAND gate 302 is small —essentially just the gate input of a single PFET (P2 314 in FIG. 3)—with the load, from the delay element 304 much smaller. The transistors P1 320, N1 326 and P2 314 in FIG. 3 are comparable (in dimensions) to the transistors P1 114 and N1 116 in a conventional CMOS inverter shown in FIG. 1 100 that drives the same capacitive load $C_{OUT}$ 104 in FIGS. 1 and 312 in FIG. 3. The gate footprint of the proposed schematic 300 (in FIG. 3) is not expected to be larger than 1.7×-2.0× of the CMOS inverter it replaces. Note that the proposed schematics are preferred as replacement candidates of CMOS inverters only when driving large loads—that offer the opportunity for larger energy reductions.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An apparatus, comprising:
    an inverter having an input terminal and an output terminal;
    a first N-channel field effect transistor (NFET) and a first P channel field effect transistor (PFET) with their drain terminals shorted together at the output terminal of the inverter, a source terminal of the first NFET and a source terminal of the first PFET are connected to a ground and a power supply, respectively;

a second PFET having a source terminal and a drain terminal configured to couple the output terminal of the inverter to a harvest terminal whose capacitance holds harvested charge at a voltage lower than a voltage of the power supply;

the input terminal and the output terminal of the inverter, during operation, having electric potentials making full-swing transitions between the voltage of the power supply and a voltage of the ground, the input terminal of the inverter connected directly to a gate input terminal of the first PFET;

a second NFET having a gate input terminal configured to be driven by the input terminal of the inverter and having a source terminal and a drain terminal connected to the ground and the output terminal of the inverter, respectively; and a 2-input NAND gate with its inputs configured to be driven by the input terminal and the output terminal of the inverter, the 2-input NAND gate having an output terminal configured to drive a gate input terminal of the second PFET and an input terminal of a delay element having an inverted output configured to drive the first NFET of the inverter.

2. The apparatus of claim 1, wherein the second PFET is configured to transfer charge to the harvest terminal holding harvested charge from the output terminal of the inverter following a low-to-high logic transition at the input terminal of the inverter, the charge transfer configured to be self-disabled by a decrease of an inverter output voltage from the inverter that sets the output terminal of the 2-input NAND gate to a voltage of the power supply as the inverter output voltage decreases below a logic threshold voltage of the 2-input NAND gate.

3. The apparatus of claim 2, wherein, during operation, the decrease of the inverter output voltage is reinforced by the first NFET when a delayed, leading-edge low-to-high logic transition at the gate input terminal of the first NFET completes a high-to-low transition at the output terminal of the inverter while transferring charge from the output terminal of the inverter to the ground.

4. The apparatus of claim 2, wherein:
the logic threshold voltage of the 2-input NAND gate is greater than a voltage at the harvest terminal at which harvested charge is held;
the delay element having a delay substantially equal to a time for the inverter output voltage to decrease from the voltage of the power supply to a voltage substantially equal to the logic threshold voltage of the 2-input NAND gate.

5. An apparatus comprising:
an inverter including a power supply, ground, a p-channel field effect transistor (PFET), an n-channel field effect transistor (NFET), a harvest terminal, an input terminal and an output terminal,
the inverter configured to be responsive to a low-to-high transition at the input terminal and configured to (1) electrically couple, via the PFET, the output terminal to the harvest terminal in response to an electric potential at the output terminal approximately exceeding an electric potential at the harvest terminal, and (2) electrically couple, via the NFET, the output terminal to ground while decoupling, via the PFET, the output terminal from the harvest terminal in response to the electric potential at the output terminal being approximately less than or equal to the electric potential at the harvest terminal.

6. The apparatus of claim 5, wherein the inverter further includes a NAND gate that has a first NAND gate input terminal coupled to the input terminal of the inverter and a second NAND gate input terminal coupled to the output terminal of the inverter, the NAND gate configured to generate an active low pulse at an output terminal of the NAND gate initiated by the low-to-high transition at the input terminal of the inverter.

7. The apparatus of claim 5, wherein:
the PFET is a first PFET, and the inverter further includes:
a NAND gate that has a first NAND gate input terminal coupled to the input terminal of the inverter and a second NAND gate input terminal coupled to the output terminal of the inverter, the NAND gate configured to generate an active low pulse at an output terminal of the NAND gate initiated by the low-to-high transition at the input terminal of the inverter; and
a second PFET including a gate input electrically coupled to the input terminal of the inverter, a source terminal electrically coupled to the power supply, and a drain terminal electrically coupled to the output terminal of the inverter, a high-to-low transition at the input terminal of the inverter with the second PFET configured to electrically couple the power supply to the output terminal of the inverter, to produce a low-to-high transition at the output terminal of the inverter.

8. The apparatus of claim 5, wherein the inverter includes a NAND gate that has a first NAND gate input terminal coupled to the input terminal of the inverter and a second NAND gate input terminal coupled to the output terminal of the inverter, the NAND gate configured to generate, at an output terminal of the NAND gate, an active low pulse in response to the low-to-high transition at the input terminal of the inverter,
the PFET configured to electrically couple the output terminal of the inverter to the harvest terminal in response to a gate input terminal of the PFET being triggered by the active low pulse from the NAND gate.

9. The apparatus of claim 5, wherein the inverter further includes:
an inverting delay element electrically coupled to the ground, the inverting delay element including an input terminal and an output terminal; and
a NAND including a first NAND gate input terminal, a second NAND gate input terminal, and an output terminal, the first NAND gate input terminal electrically coupled to the input terminal of the inverter, the second NAND gate input terminal electrically coupled to the output terminal of the inverter, the output terminal of the NAND gate electrically coupled to the output terminal of the inverter via the NFET and electrically coupled to the input terminal of the inverting delay element, the NAND gate configured to generate, at the output terminal of the NAND gate, an active low pulse initiated by the low-to-high transition at the input terminal of the inverter,
the NFET having a gate terminal electrically coupled to the output terminal of the inverting delay element, a drain terminal electrically coupled to the output terminal of the inverter, and a source terminal electrically coupled to the ground, such that, at the output terminal of the inverting delay element, the active low pulse is delayed and inverted by the inverting delay element.

10. The apparatus of claim 5, wherein the inverter further includes:

an inverting delay element electrically coupled to the ground, the inverting delay element, including an input terminal and an output terminal; and a NAND including a first NAND gate input terminal, a second NAND gate input terminal, and an output terminal, the first NAND gate input terminal electrically coupled to the input terminal of the inverter, the second NAND gate input terminal electrically coupled to the output terminal of the inverter, the output terminal of the NAND gate electrically coupled to the output terminal of the inverter via the NFET and electrically coupled to the input terminal of the inverting delay element, the NAND gate configured to generate, at the output terminal of the NAND gate, an active low pulse in response to the low-to-high transition at the input terminal of the inverter, the NFET having an input terminal electrically coupled to the input terminal of the inverter, a drain terminal electrically coupled to the output terminal of the inverter, and a source terminal electrically coupled to the ground, the NFET configured to maintain a low impedance path between the output terminal of the inverter and the ground.

11. The apparatus of claim 5, wherein the inverter further includes:

a NAND gate that has a first NAND gate input terminal coupled to the input terminal of the inverter and a second NAND gate input terminal coupled to the output terminal of the inverter, the NAND gate configured to generate, at an output terminal of the NAND gate, an active low pulse in response to the low-to-high transition at the input terminal of the inverter, the NFET having a gate terminal electrically coupled to the input terminal of the inverter, a drain terminal electrically coupled to the output terminal of the inverter, and a source terminal electrically coupled to the ground, the NFET configured to transfer charge at the output terminal of the inverter to the ground in response to an output voltage at the output terminal of the inverter decreasing and approaching a voltage of the harvest terminal.

12. The apparatus of claim 5, wherein the inverter further includes:

a NAND gate that has a first NAND gate input terminal coupled to the input terminal of the inverter and a second NAND gate input terminal coupled to the output terminal of the inverter, the NAND gate configured to generate, at an output terminal of the NAND gate, an active low pulse in response to the low-to-high transition at the input terminal of the inverter; and the PFET electrically coupled to the output terminal of the NAND gate, the output terminal of the inverter, and the harvest terminal, the PFET configured to be turned on by the active low pulse and to transfer charge from the output terminal of the inverter to the harvest terminal as an output voltage at the output terminal of the inverter decreases until the output voltage approaches a voltage, of the harvest terminal, equal to a voltage between the power supply and the ground.

13. The apparatus of claim 5, wherein the inverter further includes:

a NAND gate, the NAND gate including a first NAND gate input terminal coupled to the input terminal of the inverter and a second NAND gate input terminal coupled to the output terminal of the inverter, the NAND gate configured to generate, at an output terminal of the NAND gate, an active low pulse in response to the low-to-high transition at the input terminal of the inverter, the PFET electrically coupled to the output terminal of the inverter, the power supply, and the harvest terminal, the PFET configured to be turned on by a leading edge of the active low pulse when an input voltage at the NAND gate increases past a logic threshold voltage of the NAND gate.

14. The apparatus of claim 5, wherein the circuit includes:

the PFET electrically coupled to the output terminal of the inverter, the power supply, and the harvest terminal, the PFET configured drive a harvested charge from the power supply to the harvest terminal, the inverter further including:

a NAND gate, the NAND gate including a first NAND gate input terminal coupled to the input terminal of the inverter and a second NAND gate input terminal coupled to the output terminal of the inverter, the NAND gate configured to generate, at an output terminal of the NAND gate, an active low pulse initiated by the low-to-high transition at the input terminal of the inverter, the NAND gate producing no transition at the output terminal of the NAND gate in response to a high-to-low transition at the input of the inverter.

15. The apparatus of claim 5, wherein the inverter further includes:

a NAND gate configured to generate, at an output terminal of the NAND gate, an active low pulse initiated by a low-to-high transition at the input terminal of the inverter, the active low pulse including a leading edge such that the NAND gate is triggered, by the low-to-high transition at the input terminal of the inverter, to begin transferring charge from the output terminal of the inverter to the harvest terminal of the inverter triggered by the leading edge of the active low pulse.

16. An apparatus, comprising:

an inverter having an input terminal and an output terminal;

a first P-channel field-effect transistor (PFET);

a second PFET connected in series with the first PFET, the first PFET having a source terminal configured to be connected to a power supply and having a gate terminal connected to the input terminal of the inverter, the second PFET having a source terminal configured to be connected to the output terminal of the inverter and a drain terminal configured to be connected to a harvest terminal;

an N-channel field-effect transistor (NFET) having a drain terminal connected to a drain terminal of the first PFET and to the output terminal of the inverter, the NFET having a source terminal configured to be connected to a ground; and a NAND gate including a first NAND input terminal and a second NAND input terminal, the first NAND input terminal and the second NAND input terminal of the NAND gate being connected with and configured to be driven by the input terminal of the inverter and the output terminal of the inverter, the NAND gate having an output terminal connected with a gate input terminal of the second PFET and an input terminal of a delay element that has an inverted output terminal configured to be connected with the NFET of the inverter, the NAND gate configured to generate an active low pulse at the output terminal of the NAND gate.

17. The apparatus of claim 16, wherein the NFET is configured to transfer a charge at the output terminal of the inverter to the ground in response to an output voltage at the output terminal of the inverter decreasing as it approaches an electric potential of the harvest terminal.

18. The apparatus of claim 16, wherein the second PFET is configured to be turned on by the active low pulse and transfer a charge from the output terminal to the harvest terminal held at a voltage between an electric potential of the power supply and the ground.

19. The apparatus of claim 16, wherein the NAND gate is configured to generate, at the output terminal of the NAND gate, the active low pulse initiated by a low-to-high transition at the input terminal of the inverter, the second PFET configured to be turned on by the active low pulse and configured to transfer a charge from the output terminal to the harvest terminal held at a voltage between a voltage at the power supply and the ground.

20. The apparatus of claim 16, wherein the NAND gate is configured to generate, at the output terminal of the NAND gate, the active low pulse initiated by a low-to-high transition at the input terminal of the inverter, the active low pulse including a leading edge such that the NAND gate is triggered, by the low-to-high transition at the input terminal of the inverter, to transfer a charge from the output terminal of the inverter to the harvest terminal when an input voltage at the NAND gate increases past a logic threshold voltage of the NAND gate.

* * * * *

UNITED STATES PATENT AND TRADEMARK OFFICE
CERTIFICATE OF CORRECTION

PATENT NO. : 11,984,888 B2
APPLICATION NO. : 17/498220
DATED : May 14, 2024
INVENTOR(S) : Azeez Bhavnagarwala It is certified that error appears in the above-identified patent and that said Letters Patent is hereby corrected as shown below:

In the Specification

Column 4, Line 15: "with a capacitive load Gut 104. The power rail 106 at electric" should read -- with a capacitive load $C_{out}$ 104. The power rail 106 at electric --

In the Claims

Column 10, Line 14 (Claim 14, Line 1): "The apparatus of claim 5, wherein the circuit includes:" should read -- The apparatus of claim 5, wherein" --

Signed and Sealed this
Twenty-fifth Day of June, 2024

Katherine Kelly Vidal
*Director of the United States Patent and Trademark Office*